(12) United States Patent
Lin

(10) Patent No.: US 6,369,451 B2
(45) Date of Patent: *Apr. 9, 2002

(54) SOLDER BALLS AND COLUMNS WITH STRATIFIED UNDERFILLS ON SUBSTRATE FOR FLIP CHIP JOINING

(76) Inventor: Paul T. Lin, 673 Hillcrest Ter., Fremont, CA (US) 94539

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/229,139
(22) Filed: Jan. 12, 1999

Related U.S. Application Data
(60) Provisional application No. 60/071,177, filed on Jan. 13, 1998.

(51) Int. Cl.$^7$ .............................. H01L 23/48; H01L 21/60
(52) U.S. Cl. .................... 257/779; 257/737; 257/738; 257/778
(58) Field of Search ................. 257/737, 738, 257/778, 779, 735; 428/545, 209, 210; 228/180.22

(56) References Cited

U.S. PATENT DOCUMENTS

| | | | |
|---|---|---|---|
| 5,473,814 A | * 12/1995 | White | 29/840 |
| 5,542,174 A | * 8/1996 | Chiu | 29/840 |
| 5,639,696 A | * 6/1997 | Liang et al. | 437/209 |
| 5,658,827 A | * 8/1997 | Aulicino et al. | 228/180.22 |
| 5,675,889 A | * 10/1997 | Acocella et al. | 29/830 |
| 5,735,452 A | * 4/1998 | Yu et al. | 228/254 |
| 5,777,387 A | * 7/1998 | Yamashita et al. | 257/737 |
| 6,059,172 A | * 5/2000 | Chapman et al. | 228/180.22 |

* cited by examiner

Primary Examiner—Deborah Jones
Assistant Examiner—Stephen Stein
(74) Attorney, Agent, or Firm—Bo-In Lin

(57) ABSTRACT

The present invention discloses an improved method for carry out a flip chip packaging process for attaching a semiconductor integrated circuit (IC) wafer having a plurality of input/output terminals, to a substrate. The method includes the steps of: 1) securely placing a plurality of solder balls on the substrate with each of said solder balls corresponding to a location of one of the input/output terminals on the integrated circuit wafer; 2) flipping the integrated circuit wafer for aligning each of the input/output terminals of the IC wafer to one of the solder balls; and 3) mounting the IC wafer onto the substrate for placing the I/O terminals on a corresponding solder ball and applying a reflow temperature for soldering the IC wafer to the substrate.

15 Claims, 4 Drawing Sheets

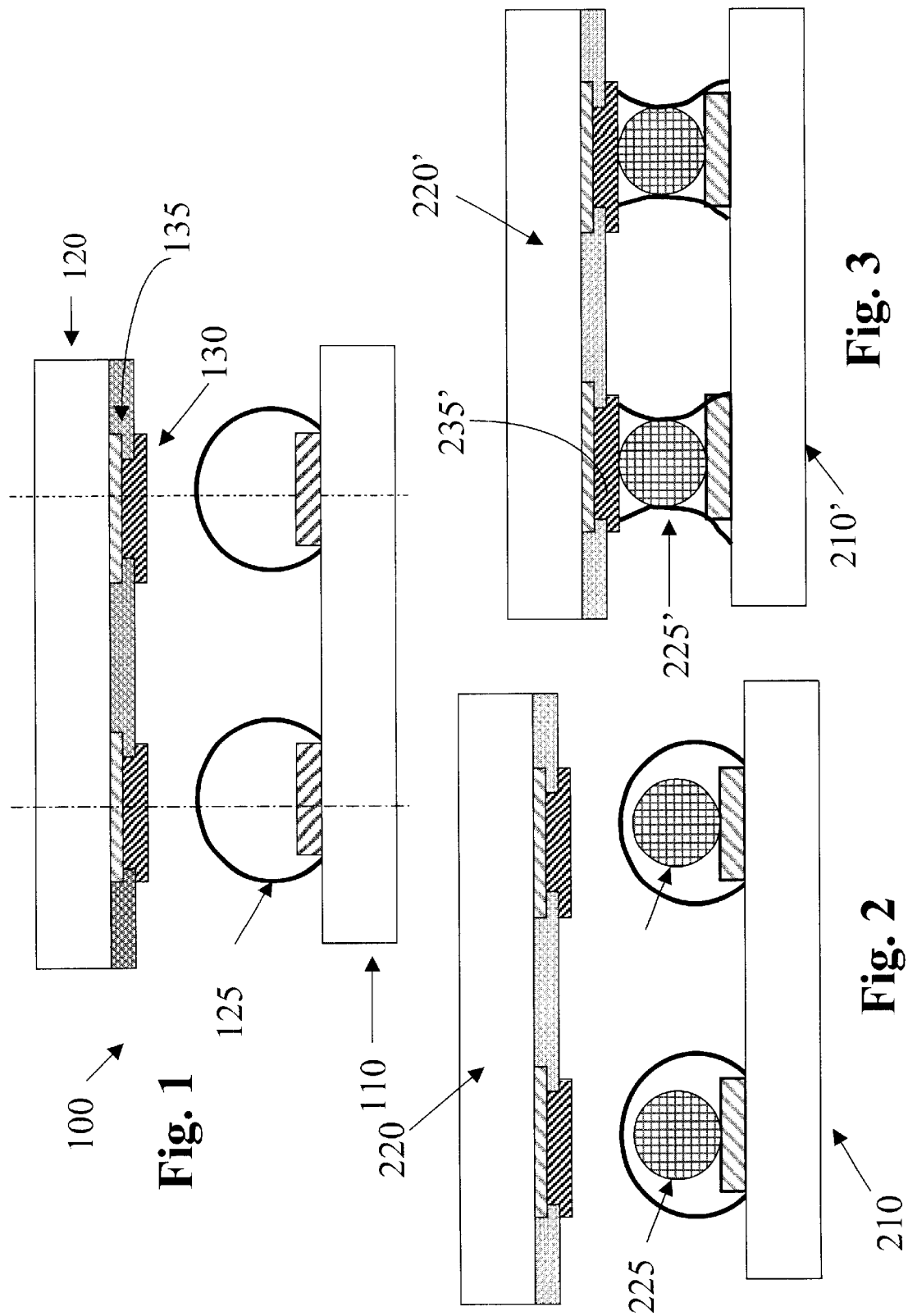

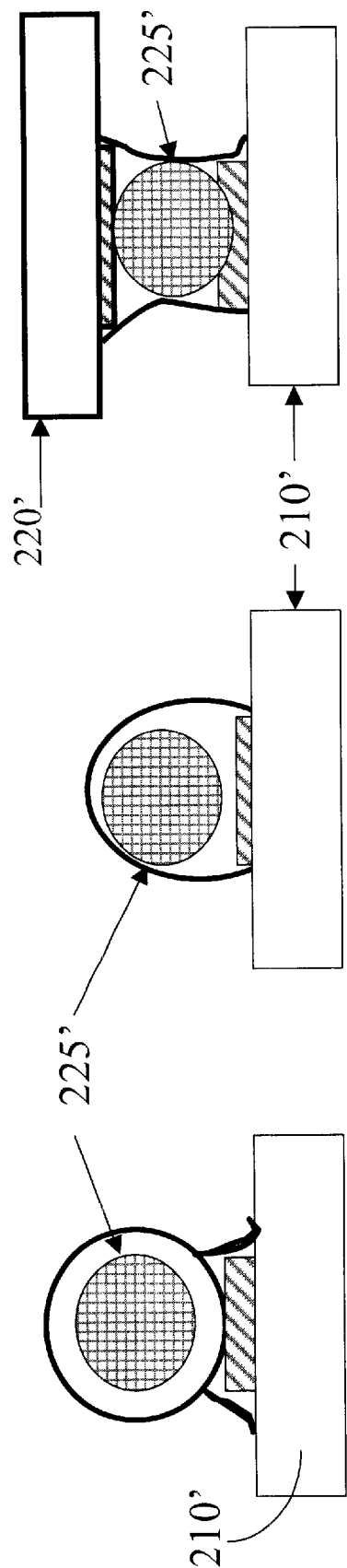

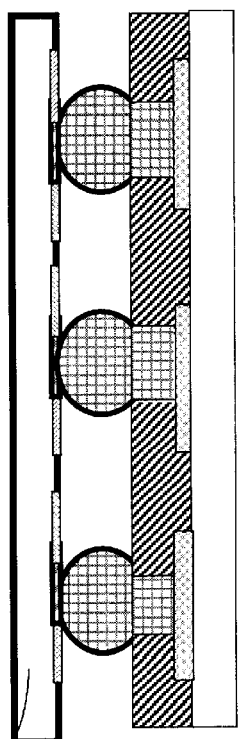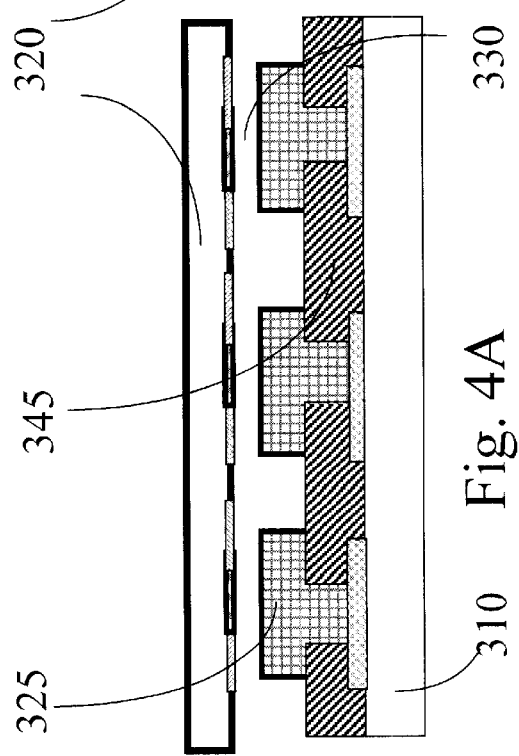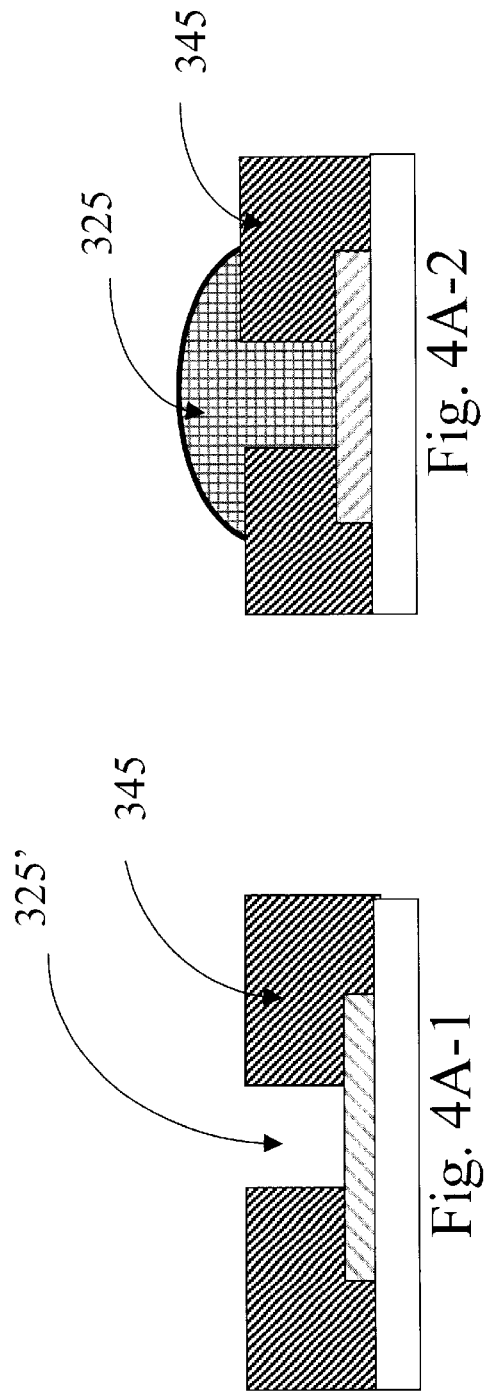

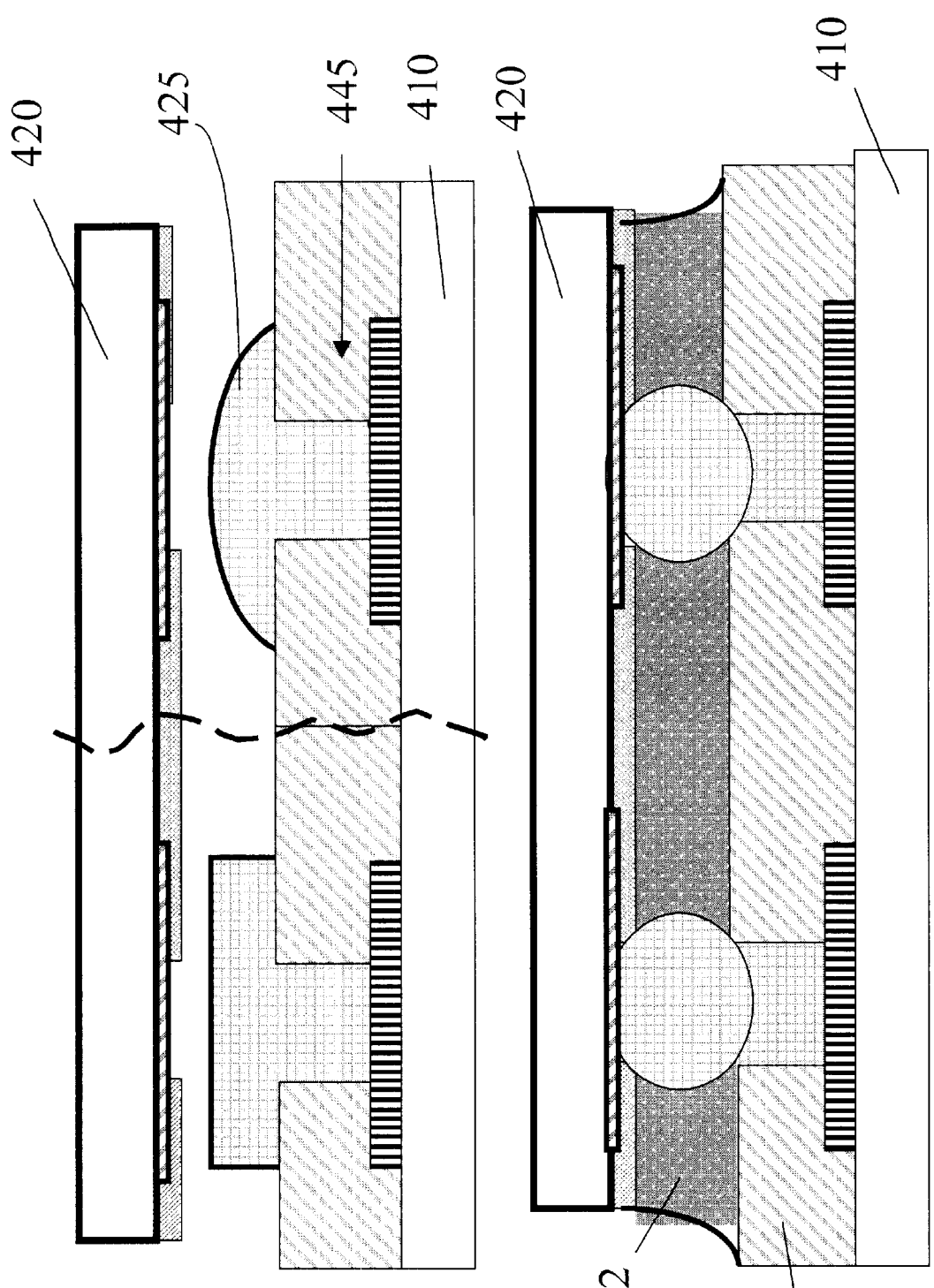

SOLDER BALLS AND COLUMNS WITH STRATIFIED UNDERFILLS ON SUBSTRATE FOR FLIP CHIP JOINING

This Formal Application claims a Priority date of Jan. 13, 1998 benefited from a Provisional Application 60/071,177 filed by the same Applicant of this Application on Jan. 13, 1998.

BACKGROUND OF THE INVENTION

1. Field of the Invention

This invention relates generally to the electronic package. More particularly, this invention relates to a novel packaging process by depositing solder balls or columns on the substrate at the chip joining sites. A major purpose of the invention is to reduce the wafer level processes thus reducing the total processing cost of the flip chip package, shortening the cycle time for flip chip implementation and improving the reliability and performance of the flip chip packages.

2. Description of the Prior Art

General practice for bonding a flip chip to a substrate with existing bonded die design or layout is limited by several technical difficulties and cost considerations. Specifically, under certain applications, the bonding pitch for the flip chip is not able to satisfy the higher I/O (input/output) density requirement when the bonding pitch is less than 8 mils. This technical difficulty arises from current state of art wafer-level shadow mask evaporation or screen printing process. Current techniques for wafer-level bumping are generally limited to processes for depositing the solder balls by evaporation through a shadow mask, or solder paste on a wafer or die by using paste screen and reflow technique to generate solder bumps on the wafer. Furthermore, due to the processing steps required for "bumping" the wafer or die, the production costs of the flip chip packages are considerable higher than that of the wire-bonding or the tap automatic bonding (TAB). For these reasons, even that flip-chip in a package (FCIP) offers the advantages of small footprint, low profile, improved electrical performance, and efficient die-back heat-removal, application of flip-chip for electronic packaging is still limited to a very small percentage of high-performance and high-cost devices.

In addition to the difficulties in achieving a fine resolution for solder paste screen in "bumping" the wafer, considerations must also be given to the problems arising from difference in thermal expansion coefficient between the substrate and electronic device mounted thereon. In order to compensate for the differences in thermal expansion, the volume of solder paste bumped onto the flip chip must be carefully controlled to provide sufficient standoff height of the flip chip above the substrate. Integrity and reliability of the solder joints between the flip chip and the substrate thus depends on the standoff heights of the solder paste bumps placed onto the wafer. Special care and heavy emphasis in technology developments are concentrated on how to deposit and control the solder paste volume in order to achieve well-controlled standoff heights. However, this additional precision requirement in bumping the chip further increases the production cost of the flip chip packaging.

Modern semiconductor packages implementing flip chip typically includes a process to attach a flip chip to a printed wiring board (PWB) such as a FR-4 epoxy fiber glass board. The wafer is first bumped with lead/tin solder pads, which constitute the signal input/output (I/O), power and ground terminals on the integrated circuits (IC) fabricated on the wafer. Lead-tin solder with low-melting temperature is also applied to the pads of the board usually in the form of solder paste. The substrate has a matching footprint of these solder wettable pads. The bumped wafer is then flipped and placed in an aligned manner to the substrate to align the solder pads on the substrate and the bumps on the wafer. The IC chip is then joined to the substrate with a reflow process. As described above, the technique is limited by the resolution achievable through a paste screen process. Further reduction of pitch below 8 mils is generally difficult to accomplish by employing this technology. Due to requirement perform the bumping process in the wafer level, production costs are generally quite high for the reasons to be further discussed when compared to the techniques disclosed in this invention.

In U. S. Pat. 5,564,617 entitled "Method and Apparatus for Assembling Multi-chip Modules" (issued Oct. 15, 1996), Degani et al. disclose a multiple chip module which is assembled using a flip-chip bonding technology. Stencil printable solder-paste and surface mount equipment for interconnecting signaling input/output contact pads on devices within such a multiple-chip module. The flip chip bonding technique is simplified by use of a solder paste. The solder paste has the desirable characteristics of reflow alignment, fluxing and printability thus allowing the application of standard surface mount equipment High volume production of standard inexpensive modules is achievable to provide high-density interconnections. However, Degani's patented method is limited by the technical difficulties that the resolution is limited both by the precision in controlling the solder paste and the screen technique.

Degani's patented method is further limited by the problems arising from difference in thermal expansion coefficient between the substrate and the mounted electronic device. Again, in order to compensate for the differences in thermal expansion, the volume of solder paste bumped onto the substrate must be carefully controlled to provide sufficient standoff height of the flip chip above the substrate. Integrity and reliability of the solder joints between the flip chip and the substrate thus depends on the standoff heights of the solder paste screen-printed onto the substrate. Special care and emphasis in technology must be developed on how to deposit and control the solder paste volume in order to achieve well-controlled standoff heights. Therefore, this additional precision requirement in controlling volume of the solder-paste printed onto the substrate further increases the production cost in applying Degani's technology to flip chip packaging.

Therefore, a need still exits in the art to provide an improved structure and procedure for implementing the flip chip in electronic packages such that the difficulties and limitations described above can be overcome. It is further desirable that the improved procedure provides packaging configurations and process to conveniently control the standoff height of the flip chip and to reduce the surface tension at the soldered joints such that more reliable high performance electronic packages can be provided at a lower cost

SUMMARY OF THE PRESENT INVENTION

It is therefore an object of the present invention to provide a new flip chip packaging method implemented with new structural and metallurgical features in order to overcome the aforementioned difficulties encountered in the prior art.

Specifically, it is an object of the present invention to provide a new flip-chip packaging process wherein a pre-designated number of solder balls are placed on a substrate corresponding to input/output signal terminals of the flip chip to simplify the packaging process. More costly and complicated bumping processes of solder evaporation or solder photolithographic plating performed on the wafer are no longer required.

Another object of the present invention is to provide a new flip-chip packaging process wherein a pre-designated number of solder balls are placed on a substrate. The placement of the solder balls corresponds to the locations of the input/output signal terminals of the flip chip. Higher precision of connection placement is provided such that a lower pitch can be achieved. Smaller pitch of connections can be accomplished without being hindered by the resolution limitation when a paste screen technology is applied on either the wafer or the substrate Another object of the present invention is to provide a new flip-chip packaging process wherein a pre-designated number of solder balls are placed on a substrate. The solder balls are placed corresponding to input/output signal terminals of the flip chip. Also, specially configured solder balls are employed to produce a required standoff height. The difficulties of precisely controlling the amount of solder pastes for bumping the wafer or for depositing on the substrate are thus eliminated and the packaging process is greatly simplified.

Another object of the present invention is to provide a new flip-chip packaging process wherein a pre-designated number of either solder balls with core or column are placed on a substrate. The solder balls are placed corresponding to input/output signal terminals of the flip chip. The column type of joints can be conveniently formed to further reduce the pitch between the joints while minimize the costly wafer level processes.

Another object of the present invention is to provide a new flip-chip packaging process wherein a pre-designated number of either solder balls with core or column are placed on a substrate. The spaces between the solder balls are then filled with specially processed stratified under-filling materials. The stratified under-filling materials produce a stress-gradient during the thermal expansions experienced in the temperature cycles during the manufacturing processes. The package integrity is improved by greatly reducing the likelihood of de-lamination while prolonging the fatigue life of solder joints.

Briefly, in a preferred embodiment, the present invention includes an improved method for carry out a flip chip packaging process for attaching a semiconductor integrated circuit (IC) wafer having a plurality of input/output terminals, to a substrate. The method includes the steps of 1) securely placing a plurality of solder balls on the substrate with each of said solder balls corresponding to a location of one of the input/output terminals on the integrated circuit wafer; 2) flipping the integrated circuit wafer for aligning each of the input/output terminals of the IC wafer to one of the solder balls; and 3) mounting the IC wafer onto the substrate for placing the I/O terminals on a corresponding solder ball and applying a reflow temperature for soldering the IC wafer to the substrate.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 1 is a cross sectional view of a solder-ball loaded substrate of this invention ready for joining to a flip chip;

FIG. 2 is a cross sectional view of a coated-solder-ball loaded substrate of this invention ready for joining to a flip chip with specific height requirement;

FIGS. 3 to 3C are a cross sectional views of a hour-glass solder-joints of this invention after a supporting substrate is joined to a flip chip to provide stronger solder joints and to satisfy certain height requirements;

FIGS. 4A to 4B are cross sectional views of the structure of solder columns supported on a substrate of this invention before and after an integrated circuit (IC) device is joined to the substrate; and FIGS. 5A and 5B are cross sectional views of the structure of solder columns with stratified underfill layers supported on a substrate of this invention before and after an integrated circuit (IC) device is joined to the substrate.

DETAILED DESCRIPTION OF THE PREFERRED EMBODIMENT

Please refer to FIG. 1 for a cross sectional view of a flip-chip package assembly 100. The package assembly 100 includes a solder-ball loaded substrate 110 for supporting and providing external electric contacts for an integrated circuit (IC) chip 120. A pre-determined number of solder balls 125 are placed on the substrate at each of the joining locations for attaching to the flip chip 120. Employing the same equipment designed to place the solder balls on a ball-grid-array (BGA) substrate can carry out placement of solder balls. Therefore, additional investments for new infrastructure or solder ball placement equipment are not required. The exact distances between the solder balls 125 placed onto the substrate 110 depend on the pitch between the flip-chip pads 130 formed on the flip chip 120. The flip chip 120 includes a plurality of circuit metalization 135 with metallic compositions of aluminum, copper, or aluminum-copper alloys. The flip chip pads 130 are formed on the flip-chip circuit metalization 135. The flip-chip pads 130 are composed of solder wettable metalization such as zincated nickel-gold (Ni/Au) plating.

Electrical contact to the solder balls 125 are provided on the top surface of the substrate 110 with flex circuits such as polyimide film with copper foil traces. The substrate 110 can also be a laminated multiple-layer printed wire board (PWB), a multiple ceramic layer, or a copper core substrate such as Prolinx copper core BGA (C2BGA™). The pitch of the flip-chip pads 130 is approximately the sum of the diameter of the solder balls 125 and the distance between the solder balls 125. If the pitch of the flip-chip pads 130 is 90 $\mu$m, the spacing between the solder balls 125 for the maximum collapsed joint is 25 $\mu$m, the diameter of the solder balls is about 90 $\mu$m–25 $\mu$m, i.e., 65 $\mu$m.

The loaded solder balls 125 placed on the substrate 110 as described above may encounter a difficulty that the stand-off height may not be sufficient when the diameter of the solder balls 125 becomes very small, e.g., 65 $\mu$m. FIGS. 2 and 3 show two substrate 200 and 200' loaded with coated standoff spacers, i.e., coated solder balls 225 and solder balls 225' containing hourglass-ready core respectfully, to resolve this difficulty. A sufficient standoff height is often required to improve the solder-joint fatigue life resulting from surface tensions between the solder joints. The strain of displacement is generated due to a difference of thermal expansions between the substrates 210 and 210' and flip-chips 220 and 220'. Further details of the differences in coefficients of thermal expansion will be described below. A larger standoff height eased the stress and strain imposed on the solder joints. For the purpose of increasing the standoff heights, specially coated solder balls 225 or solder balls 225' containing hourglass-ready core are employed. The solder balls 225 and the specially configured solder balls 225' for generating hourglasses solder columns include a lead or copper core ball 225-1 and hourglass 225'-1 coated with molten layer 225-1 and 225'-1 of electric solder, e.g., a 63Sn/37Pb solder coating layer. The core ball or the hourglass-ready core has a high melting point After reflow, the coating layer, i.e., layer 225-2 or 225'-2, is melted to form the solder joints with the flip-chip pads 230 and 230'. The core balls and hourglasses, i.e., balls 225-1 and hourglass 225'-1, with a higher melting point, remains substantially unchanged in their original shapes. Referring to FIGS. 3A to 3C for the processes the hourglass solder columns are formed. In FIG. 3A, the hourglass-ready coated solder ball 225' is placed on the substrate 210'. After a first reflow process, the hourglass-ready solder balls 225' are joined to the substrate 210' forming the bottom half of the hourglass. Then the flip chip 220' is joined to the substrate through the solder-balls 225'. A second reflow process is performed. The solder pads on the flip chip 220' are melted to form the top half of the hourglass solder-columns 225'. Compared to the loaded solder ball substrate shown in FIG. 1, a greater standoff height can be achieved when coated solder balls or solder hourglasses are applied.

FIGS. 4A and 4B show another preferred embodiment of this invention before and after the flip chip 320 is joined to the solder column loaded substrate 310 respectively. The substrate 310 supports a plurality of I-shaped solder columns 325. The I-shaped solder columns 325 are plated solder columns surrounded by photo-imageable layer 345. The photo-imageable layer 345 can be an organic layer with a height ranging between 25 to 70 $\mu$m. The photo-imageable layer 345 will not reflow during a flip-chip joining operation, therefore, the structure can sustain a greater surface tension. The configuration is especially useful for fine pitch flip chips, e.g., pitch between the flip-chip pads 330 less than eight mils. The solder columns 325 can be placed with smaller distance between each other to adapt to existing wire bond and pad locations. The columns 324 can also be adjusted for different height flexibly. Furthermore, the surrounding photo-imageable layer strengthens the structure under the influence of the surface tension imposed on the joints. The organic photo-imageable layer 345 can be spayed or screen aligned. As that shown in FIG. 4A-1, the photo-imageable layer 345 is photo-processed and etched to form a plurality of column holes 325'. Since plating techniques typically forms the traces on the substrate 310, as that shown in FIG. 4A-2, a solder plating operation can fill the column holes 325' to form the solder columns 325. The solder columns 325 can be formed with different materials than the flip-chip pads. The photo-imageable layer 345 can withstand a reflow temperature ranging from 200 to 400 YC. The photo-imageable layer 345 can be a water or solvent dissolvable material, and thus can be conveniently removed after a reflow operation.

FIGS. 5A and 5B show another preferred embodiment of this invention before and after the flip chip 420 is joined to the substrate 410 respectively. A simplified method is illustrated where a photosensitive layer 445 is employed to form the solder columns 425 and the under-fill layer 445. A photosensitive layer 445 is first formed on the substrate 410 where interconnecting conductive traces are provided. The photosensitive layer is first photo-processed and etched to form the solder column holes. A solder plating process is then carried out to fill the solder column holes and bump the substrate above each solder column 425 similar to that shown in FIGS. 4A-1 and 4A-2. It is noted that the substrate 410 has a thermal expansion coefficient (TCE) of about 25 to 35×10−6 inch/YF while the flip-chip 420 has a TCE ranging from 3 to 10×10−6 inch/YF. This mismatch in TCE greatly impacts on the fatigue life of the solder joints and affects the reliability of the electronic package. A photo-imaging operation can be applied to adjust the thermal expansion coefficients of the under-fill layer 445. The mechanical properties of the under-fill layer 445 can be adjusted to minimize the potential of de-lamination at the interface between the under-fill and the flip chip. Specifically, a photo-imaging process can be employed to stratify the under-fill layer 445 into a top layer 445-1 and a bottom layer 445-2. The top underfill layer 445-1 has a TCE substantially the same as the flip chip and near the range of about 4–14×106 inch/YF. While, the lower stratified under-fill layer 445-2 has a TCE substantially the same as that of the substrate 410 in the range of 15–35×10−6 inch/YF. Since a wafer bumping process conventionally performed on a flip chip 410 requires a blanket under bump metallurgy (UBM) process. And, the UMB process is usually a sputter process performed on a wafer level, the process applied here for forming the solder columns 425 and the stratified under-fill layer 445-1 and 445-2 cannot be applied to a process performed on the wafer level. Only the substrate 410 with individual trace patterns can be employed for applying a photo-imaging process to generate the solder columns and the stratified underfill layers.

In one preferred embodiment, one of the underfill-layers, e.g., the top underfill layer 445-1, is an underfill material which can be liquidated, e.g., a silica filler or a liquid epoxy resin. These liquidated underfill materials can be applied as liquid to uniformly fill the spaces between the flip chip 420 and the substrate 410. Small gaps are easily filled with low level of voids to improve the attachment strength between the flip-chip 420 and the substrate 410. The liquidated underfill layer 445-1 is solidified at a lower temperature thus securely adhering the flip chip 420 the substrate 410.

According to above drawings and descriptions, this invention discloses a method for attaching an integrated circuit (IC) wafer to a substrate. The IC wafer has a plurality of input/output terminals each having a flip-chip pad. The method includes the steps of a) securely placing a plurality of solder attaching means on the substrate with each of the solder attaching means corresponding to a location of one of the input/output terminals on the integrated circuit wafer for soldering and attaching to the flip-chip pad; b) flipping the integrated circuit wafer and aligning each flip-chip pad of the IC wafer to one of the solder attaching means; and c) mounting the IC wafer onto the substrate for placing each of the I/O terminals on a corresponding solder attaching means and applying a reflow temperature for soldering and attaching the IC wafer to the substrate. In a preferred embodiment, the step a) of securely placing a plurality of solder attaching means on the substrate is a step of securely placing a plurality of solder balls on the substrate. In a preferred embodiment, the step a) of securely placing a plurality of solder attaching means on the substrate is a step of securely placing a plurality of solder columns on the substrate. In a preferred embodiment, the step a) of securely placing a plurality of solder attaching means on the substrate is a step of securely placing a plurality of coated column each having a high-melting-point hourglass-shaped core with a predetermined standoff height. In a preferred embodiment, the step a) of securely placing a plurality of solder attaching means on the substrate is a step of securely placing a plurality of coated solder balls each having a high-melting-point ball-shaped core with a predetermined standoff height. In a preferred embodiment, the step a) of securely placing a plurality of solder columns is a step of placing a plurality of I-shaped solder column on the substrate with predetermined standoff height. In a preferred embodiment, the method further includes of a1) placing a photo-imageable layer between the solder attaching means wherein the photo-imageable layer is provided to sustain a reflow temperature. In a preferred embodiment, the step a1) of placing a photo-imageable layer is a step of placing a solvent dissolvable photo-imageable layer. In a preferred embodiment, the step a1) of placing a photo-imageable layer is a step of placing an organic photo-imageable layer. In a preferred embodiment, the step a) of securely placing a plurality of solder attaching means on the substrate comprising steps of: a2) forming a photo-imageable layer on the substrate; a3) opening a plurality of holes for placing the solder attaching means by photo-processing and etching the photo-imageable layer; a4) forming the solder attaching means by filling the holes with a soldering material. In a preferred embodiment, the step a4) of forming the solder attaching means by filling the holes with a soldering material is a step of employing a plating process with a solder paste for filling the holes. In a preferred embodiment, the step a) of securely placing a plurality of solder attaching means on the substrate comprising steps of further comprising a step of a5) removing the photo-imageable layer after the step a4) of forming the solder attaching means by filling the holes with a soldering material. In a preferred embodiment, the step a1) of placing a photo-imageable between the solder attaching means is a step of employing the photo-imageable layer as an under-fill layer. In a preferred embodiment, the step of employing the photo-imageable layer as an under-fill layer further comprising a step of photo-processing the photo-imageable layer into two stratified under-fill layers with two different thermal expansion coefficients.

Furthermore, the present invention discloses a substrate provided for mounting an integrated circuit (IC) wafer thereon. The IC wafer has a plurality of input/output terminals each having a flip-chip pad. The substrate includes a plurality of solder attaching means disposed on top the substrate with each of the solder attaching means corresponding to a location of one of the input/output terminals on the integrated circuit wafer for soldering and attaching to the flip-chip pad. In a preferred embodiment, In a preferred embodiment, the plurality of solder attaching means on the substrate are a plurality of solder balls disposed on top of the substrate. In a preferred embodiment, the plurality of solder attaching means on the substrate are a plurality of solder columns disposed on top of the substrate. In a preferred embodiment, the plurality of solder attaching means on the substrate are a plurality a plurality of coated column each having a high-melting-point hourglass-shaped core with a predetermined standoff height. In a preferred embodiment, the plurality of solder attaching means on the substrate are a plurality of coated solder balls each having a high-melting-point ball-shaped core with a predetermined standoff height. In a preferred embodiment, the plurality of solder columns are a plurality of I-shaped solder column disposed on top of the substrate with predetermined standoff height. In a preferred embodiment, the substrate further includes a photo-imageable layer disposed between the solder attaching means wherein the photo-imageable layer is provided to sustain a reflow temperature. In a preferred embodiment, the photo-imageable layer disposed between the solder attaching means is a solvent dissolvable photo-imageable layer. In a preferred embodiment, the photo-imageable layer is an organic photo-imageable layer.

Furthermore, the present invention discloses a substrate provided for mounting an integrated circuit (IC) wafer thereon. The substrate includes a photo-imageable layer disposed on the substrate having a plurality of holes opened in locations corresponding to a plurality of input/output terminals of the IC wafer. In a preferred embodiment, the substrate further includes a plurality of solder attaching means filled in the holes with a soldering material. In a preferred embodiment, the solder attaching means filling the holes are solder pastes plated into the holes. In a preferred embodiment, the photo-imageable layer constituting an under-fill layer for packaging the IC wafer on the substrate. In a preferred embodiment, the under-fill layer further comprising at least two stratified under-fill layers wherein the layers having at least two different thermal expansion coefficients. The present invention further discloses a substrate provided for mounting an integrated circuit (IC) wafer thereon. The substrate includes a plurality of solder attaching means disposed on top the substrate placed at locations corresponding to a plurality of input/output terminals of the IC wafer.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An integrated circuit (IC) package assembly comprising:

an IC wafer having a plurality of input/output terminals each formed as a flip-chip solder-wettable metalization pad;

a substrate for supporting and mounting said IC wafer thereon; and said substrate further having a plurality of solder attaching means disposed on top said substrate with each of said solder attaching means corresponding to a location of one of said input/output terminals on said integrated circuit wafer suitable for directly soldering and attaching to said solder-wettable metalization pad.

2. The IC package assembly of claim 1 wherein:

said plurality of solder attaching means on said substrate are a plurality of solder balls disposed on top of said substrate suitable for directly soldering and attaching to said solder-wettable metalization pad.

3. The IC package assembly of claim 1 wherein:

said plurality of solder attaching means on said substrate are a plurality of solder columns disposed on top of said substrate suitable for directly soldering and attaching to said solder-wettable metalization pad with sufficient standoff height.

4. The IC package assembly of claim 1 wherein:

said plurality of solder attaching means on said substrate are a plurality of coated column each having a high-melting-point hourglass-shaped core with a predetermined standoff height for directly soldering and attaching to said solder-wettable metalization pad.

5. The IC package assembly of claim 1 wherein:

said plurality of solder attaching means on said substrate are a plurality of coated solder balls each having a high-melting-point ball-shaped core with a predetermined standoff height suitable for directly soldering and attaching to said solder-wettable metalization pad.

6. The IC package assembly of claim 4 wherein:

said plurality of solder columns are a plurality of I-shaped solder column disposed on top of said substrate with predetermined standoff height suitable for directly soldering and attaching to said solder-wettable metalization pad.

7. The IC package assembly of claim 1 further comprising:

a photo-imageable layer disposed between said solder attaching means wherein said photo-imageable layer is provided to sustain a reflow temperature for directly soldering and attaching solder attaching means to said solder-wettable metalization pad.

8. The IC package assembly of claim 7 wherein:

said photo-imageable layer disposed between said solder attaching means is a solvent dissolvable photo-imageable layer.

9. The IC package assembly of claim 7 wherein:

said photo-imageable layer is an organic photo-imageable layer.

10. An integrated circuit (IC) package assembly comprising:

an IC wafer having a plurality of input/output terminals each formed as a solder-wettable metalization pad;

a substrate for supporting and mounting said IC waver thereon; and said substrate further includes a photo-imageable layer disposed on said substrate having a plurality of holes opened in locations corresponding to said plurality of input/output terminals of said IC wafer.

11. The IC package assembly of claim 10 further comprising:

a plurality of solder attaching means filled in said holes with a soldering material suitable for directly soldering and attaching solder attaching means to said solder-wettable metalization contact pad.

12. The IC package assembly of claim 11 wherein:

said solder attaching means filling said holes are solder pastes plated into said holes suitable for directly soldering and attaching solder attaching means to said solder-wettable metalization contact pad.

13. The IC package assembly of claim 10 wherein:

said photo-imageable layer constituting an under-fill layer for packaging said IC wafer on said substrate.

14. The IC package assembly of claim 13 wherein:

said under-fill layer further comprising at least two stratified under-fill layers wherein said layers having at least two different thermal expansion coefficients.

15. An integrated circuit (IC) wafer comprising:

a plurality of input/output terminals wherein each of said input/output terminals comprising a solder-wettable metalization contact pad.

* * * * *